United States Patent

Clatanoff et al.

[11] Patent Number: 5,421,455
[45] Date of Patent: Jun. 6, 1995

[54] LOCKING CLIP FOR IC TRAYS

[75] Inventors: William J. Clatanoff, Travis; Albert W. Sawicki, Jr., Williamson, both of Tex.

[73] Assignee: Minnesota Mining and Manufacturing Company, Saint Paul, Minn.

[21] Appl. No.: 287,838

[22] Filed: Aug. 9, 1994

[51] Int. Cl.6 .................... B65D 73/02; B65D 21/00; B65D 85/62
[52] U.S. Cl. .................... 206/328; 206/332; 206/329; 206/334; 206/499; 206/509; 206/511; 220/23.4; 220/23.6
[58] Field of Search ............... 206/328, 329, 330, 331, 206/332, 333, 334, 387, 509, 511, 499, 504; 220/23.4, 23.6; 108/53.1, 53.5

[56] References Cited

U.S. PATENT DOCUMENTS

| | | | |
|---|---|---|---|
| 4,358,018 | 11/1982 | Wolfe | 211/41 |
| 4,535,887 | 8/1985 | Egawa | 206/328 |
| 5,067,911 | 11/1991 | Saeki | 439/526 |
| 5,085,321 | 2/1992 | Chew | 206/331 |
| 5,263,583 | 11/1993 | Ohashi | 206/334 |
| 5,310,076 | 5/1994 | Burton et al. | 220/337 |
| 5,348,150 | 9/1994 | Brenner et al. | 206/328 |

Primary Examiner—Steven N. Meyers
Assistant Examiner—Tara L. Laster
Attorney, Agent, or Firm—Gary L. Griswold; Walter N. Kirn; David W. Anderson

[57] ABSTRACT

The use of two identical clips designed for use in holding stacks of JEDEC type trays for electronic devices in a manner to protect the devices comprises a platform supporting rails engagable with the end tabs on the trays to support the trays and the clips. A latch is provided to hold the clip in place and a handle is provided to grasp the stack of trays.

13 Claims, 6 Drawing Sheets

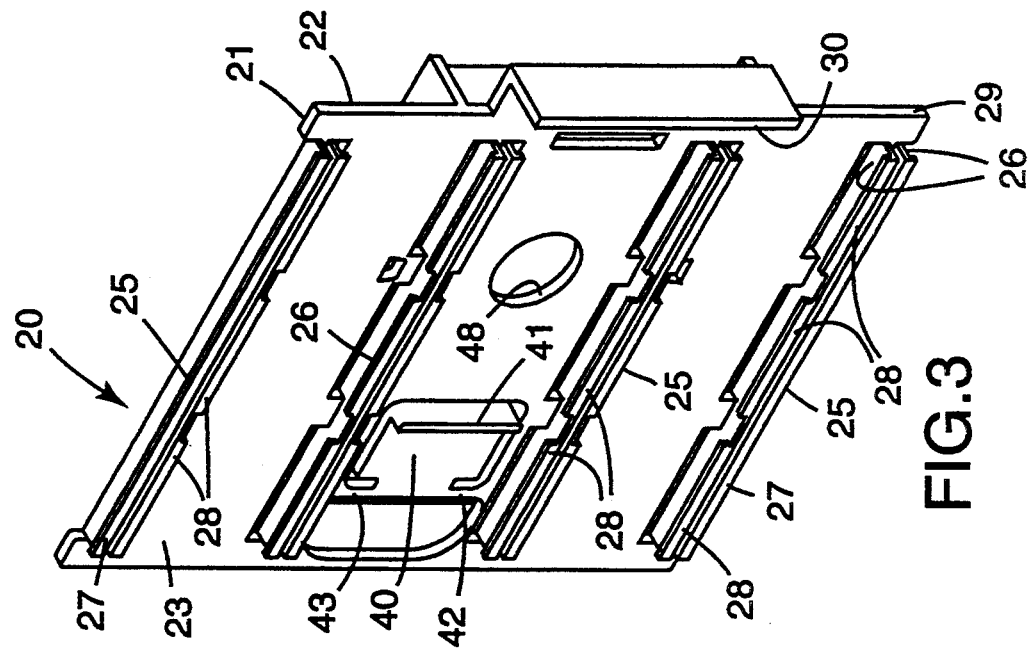
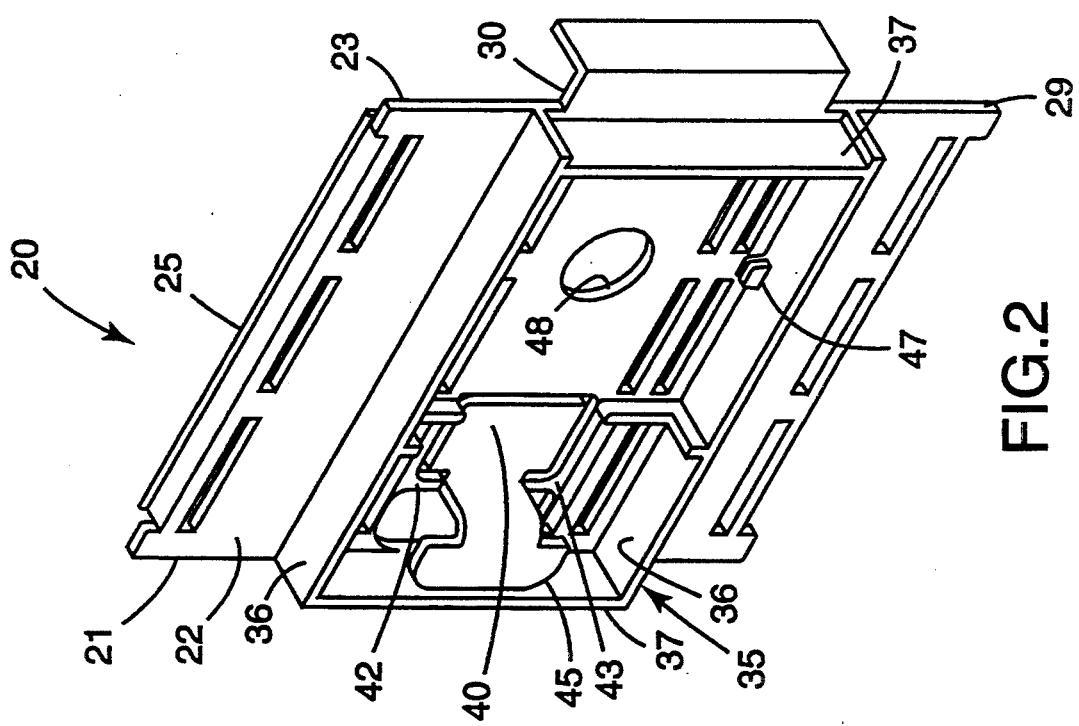
FIG.3
FIG.2

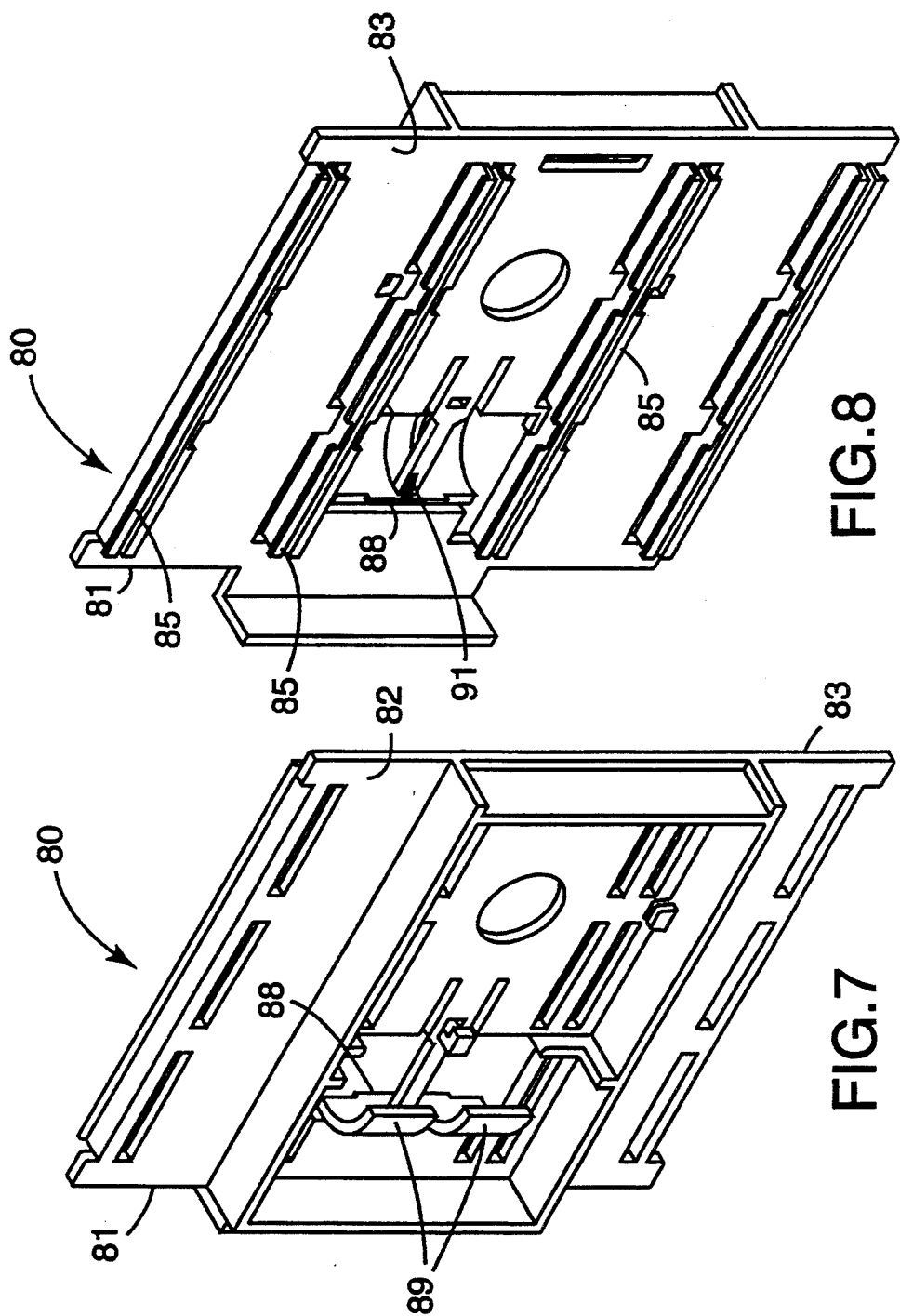

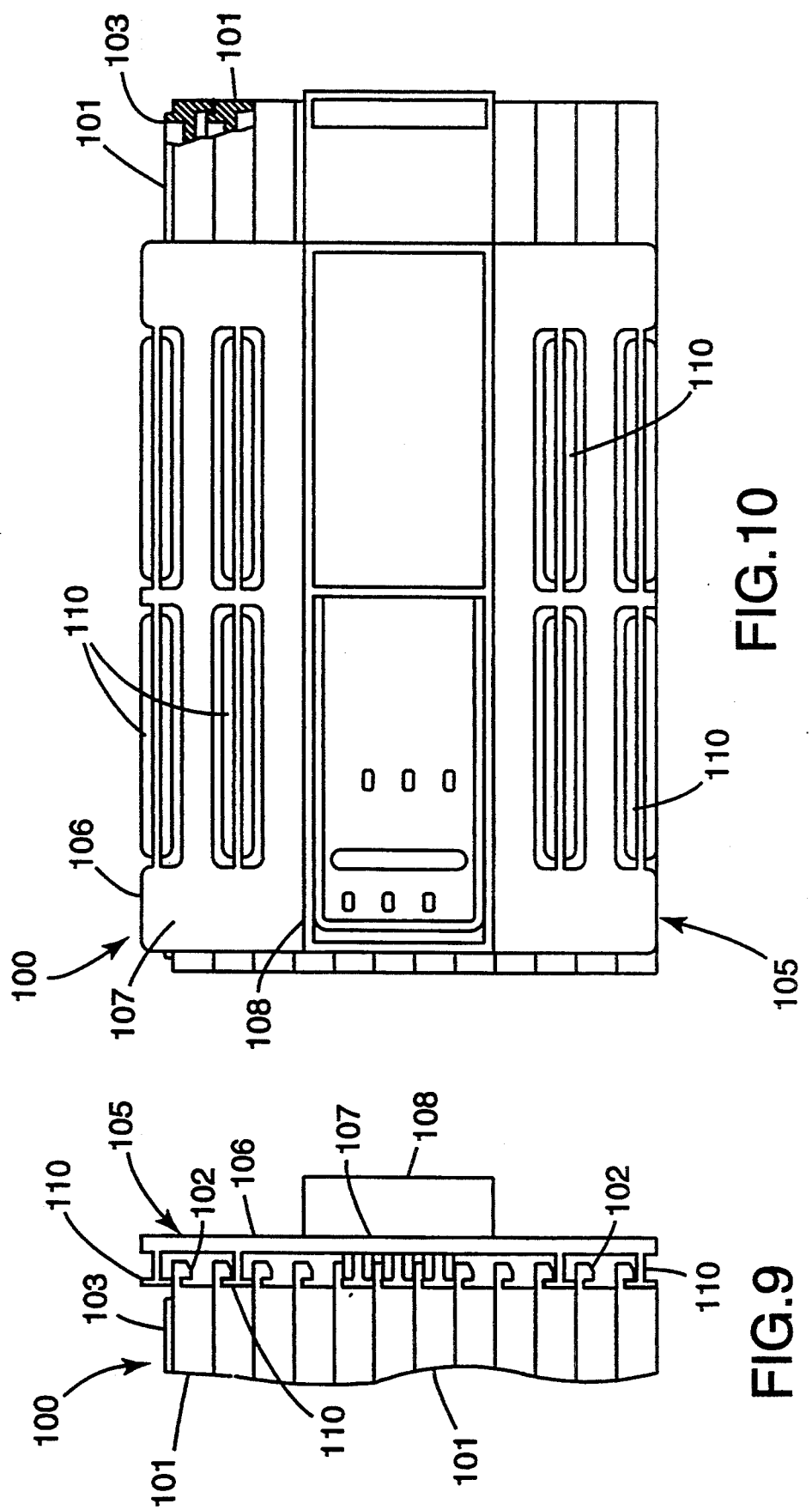

LOCKING CLIP FOR IC TRAYS

BACKGROUND OF THE INVENTION

1. Field of the Invention

This invention relates to a clip for maintaining trays of integrated circuit (IC) devices in stacks to restrict the possibility of mechanical and electrostatic damage to the IC devices between process steps and in and out of in-process storage. In one aspect the invention relates to a readily attachable and removable clip for use on standard trays serving as the transport media to protect sensitive electronic devices by holding the trays in stacks.

2. Description of the Prior Art

Integrated circuit manufacturing processes use trays as the transport media to protect sensitive electronic devices from mechanical and electrostatic damage that may occur in typical manufacturing of IC devices. These processes take stacks of trays containing IC devices as input and output requiring manual handling of stacks of trays between process steps and in and out of in-process storage. Common methods of handling stacks of trays containing IC devices presently include the use of individual or loose trays where the operator grabs stacks of 6–14 trays without any device to restrain the trays in the stack to transport the same from station to station. This technique runs the risk of operator error where trays come unstacked. Also, banding straps are used where the operator bands his stack of trays together using a secure bundle of trays to transport the IC devices from station to station. The use of a band which is buckled about the trays is not user friendly in preparing the bundle or unbundling for single tray access. Additionally, stainless steel baskets are used where the operator stacks trays with IC devices in a stainless steel basket to transport the same from station to station. Metal baskets are required to withstand the thermal environment of some process steps making them too heavy for routine tray stack handling. Further, it is believed that extruded C-clips cut to length to bind two trays together have been used.

The present invention would provide means for readily securing known trays commonly referred to as matrix trays which meet a JEDEC specification, to secure a stack of trays together such that they may readily be handled without risk of operator error, without the time constraints of applying binders around the trays and without adding significant weight to the stack. Additionally, the clips of the present invention are formed of thermoplastic material which will withstand the high temperature to which the trays may be subjected in the manufacturing process and sufficient reliance to permit the clip to be formed in a single molding operation.

SUMMARY OF THE INVENTION

Present invention provides a clip which may readily be attached and removed from one end of a stack of matrix trays for pin grid array (PGA) and surface mount type semiconductor devices as proposed by the Joint Electronic Device Engineering Counsel (JEDEC) such trays. The clip comprises a platform having a front and a rear surface with a plurality of parallel rails and stops extending from the rear surface, with a latch release and paper identification receiving area on the front surface. The platform has with leading and trailing edges. Along the trailing edge, and extending rearwardly, is an end stop and also extending from the rear surface is a movable stop forming part of the clip latch. The latch release or actuator for the latch or movable stop is positioned on the front surface. A handle is positioned on the front surface of the platform which handle aids in the placement of the clip on the stack of trays and restricts accidental displacement of the actuator and paper identification or traveler card.

The invention provides for a pair of identical clips which may be placed at opposite ends of a stack of trays to bind the stack into a unit or "brick". The use of a brick of trays, usually including 13 trays of IC devices and one empty tray as the cover of the stack, is normal procedure however, varying numbers of trays may be used. The trays conform to a standard design for thick trays, 0.480 inch high, and thin trays 0.300 inch high.

BRIEF DESCRIPTION OF THE DRAWING

Present invention will be further described with reference to the accompanying drawing wherein:

FIG. 2 is an isometric view of the front face of a clip according to the present invention;

FIG. 3 is an isometric view of the rear portion of a clip according to the present invention;

FIG. 7 is an isometric view of a further embodiment of a clip according to the present invention;

FIG. 8 is an isometric view of the rear of the clip of FIG. 7;

FIG. 9 is a fragmentary Side view showing the end of a stack of thin trays with a clip according to the present invention placed on the end; and FIG. 10 is an end view of the stack of trays of FIG. 9, partly in section, showing the front view of the clip over the end of the stack, with some details of the clip omitted.

DETAILED DESCRIPTION OF THE PRESENTLY PREFERRED EMBODIMENTS OF THE INVENTION

Figure 1:
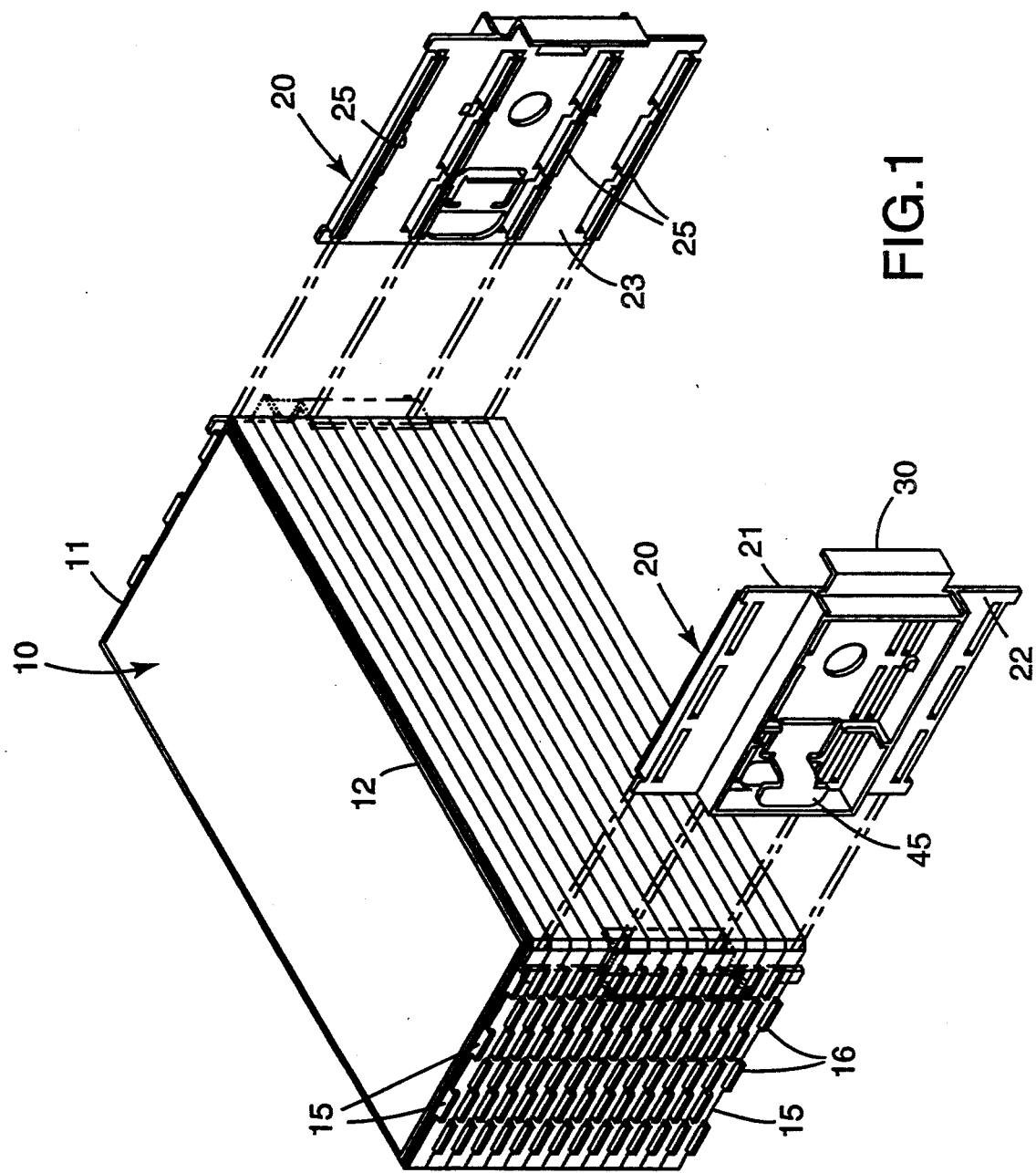
FIG. 1 is an isometric view of a stack of JEDEC type thick trays and a pair of identical clips formed in accordance with the present invention.

Referring now to FIG. 1 there is illustrated a stack 10 of thick-type trays 11 which are adapted to support integrated circuit (IC) devices in rows and columns across the widths of the trays. The recesses for receiving the IC devices are not illustrated in the drawing. The trays 11 conform to the JEDEC standard for thick trays. The thick trays 11 are normally 0.480 inch (12.2 mm) high, 5.35 inches wide, 12.4 inches long with end tabs increasing the total length to 12.70 inches, and each tray is formed with a lip 12, see FIG. 4, inset from the tray edge and extending around the upper edge of the tray 11, and with a recess 14 along the lower edge of the tray about its periphery such that the trays are readily stacked or nested with the lip on one tray engaging the recess of the next adjacent upper tray to retain the trays from shifting longitudinally or laterally in relationship to each other. Further, the end tabs formed at each end of the thick trays are short and staggered. The staggered end tabs comprise a first set of three spaced tabs 15 positioned along the upper edge of each end of the trays. The tabs 15 are L-shaped tabs projecting from the end of the trays with the foot of the L directed toward the bottom edge of the tray. Offset from the tabs 15 are end tabs 16 which are also spaced and positioned in staggered relationship to the tab 16 and projecting from the lower edge of each end of the tray. The end tab 16 are L-shaped with the foot directed toward the upper edge of the tray.

Two identical clips may slideably engage the end tabs 15 and 16 of a plurality of trays in the stack, particularly the top and the bottom trays of the stack to hold the same together. Two such clips 20 are illustrated in FIG. 1. The clips 20 are formed with platforms 21 having a front surface 22 and a rear surface 23. The clips are formed with spaced parallel rails 25 projecting from the rear surface of the platform. Two of the rails 25 are positioned along the upper and lower edge of the platform respectfully and the rails are formed to have a generally T-shaped cross section. Although as illustrated they each comprise two beams 26 extending lengthwise of the clip, which beams are closely spaced, and each beam is formed with a flange 27, or spaced flanges 28, extending in opposite directions from the free end of the beams to form the generally T-shaped cross section. This form reduces the amount of material used in injection molding the clip. The flanges 27 and 28 on the beams forming the rails 25 are spaced such that each flange is received within the L-shaped end tab on the upper or lower edge of the tray, between the leg of the L-shaped end tab 15 or 16 and the end of the tray 11.

As further illustrated, the platform of the clip 20, see FIGS. 2 and 3, has a trailing edge 29 from which extends a tray edge stop 30. The stop 30 is formed as an L-shaped member projecting from the trailing edge and then rearwardly to engage the side of the stack of trays as illustrated in FIG. 1 in the dotted line position. The stop 30 is a bar extending transversely of the clip and parallel to the trailing edge 29.

On the front surface 22 of the platform 21 is formed a rectangular box defining handle means 35. The handle means 35 provides a positive area to grasp a brick of trays. The handle means of the clip comprises the box shaped member, projecting above the platform 21, having longitudinal walls 36 and end walls 37. The walls 36 may easily be grasped by the hand to slide the clip along the end tabs of the stack of trays and simultaneously actuate the latch means which must be actuated to raise the stop member of the latch means above the end tabs of the trays to permit the clip to slide along the ends and onto the stack of trays. The latch means comprises a bar 40 formed in the plane of the platform 21. At one end of the bar, as illustrated in FIG. 3 is a stop 41 projecting rearwardly of the rear surface 23 of the platform and of one end of the bar 40. A pair of beams or trunnions 42 and 43 extend from the bar 40 to the edges of the opening in which the bar 40 is disposed. The bars 42 and 43 form torsion bars which may be flexed to afford rotation of the bar 40 to move the stop 41 from the normal position, projecting rearwardly from the rear surface 23 of the platform 21, to position generally flush with the rear surface. The movement of the stop 41 is afforded by a handle 45 which when biased in the direction toward the front face 22 of the platform 21 will cause a flexing in the bars 42 and 43 allowing the bar 40 to pivot thereabout and move the stop.

Detent means are positioned within the walls of the handle means 35 to receive a card which may carry identification of the brick of trays, which card may be called a "lot traveler". These detent means are in the form of lips 47 extending from the walls 36 and 37 of the handle 35, which lips 47 are spaced slightly above the surface 22 of the platform 21 such that the card, not shown, can be inserted under the lips to lay flat against the surface 22. An opening 48 is provided in the platform 21 centrally of the area of the detent means formed by lips 47 to permit the card to be readily removed from beneath the lips 47.

To permit the injection molding of the clip 20, slotted openings are provided to form the in-board flanges 28 of the rails 25, to form the lips 47 and to form the opening for the latch means.

Figure 4:
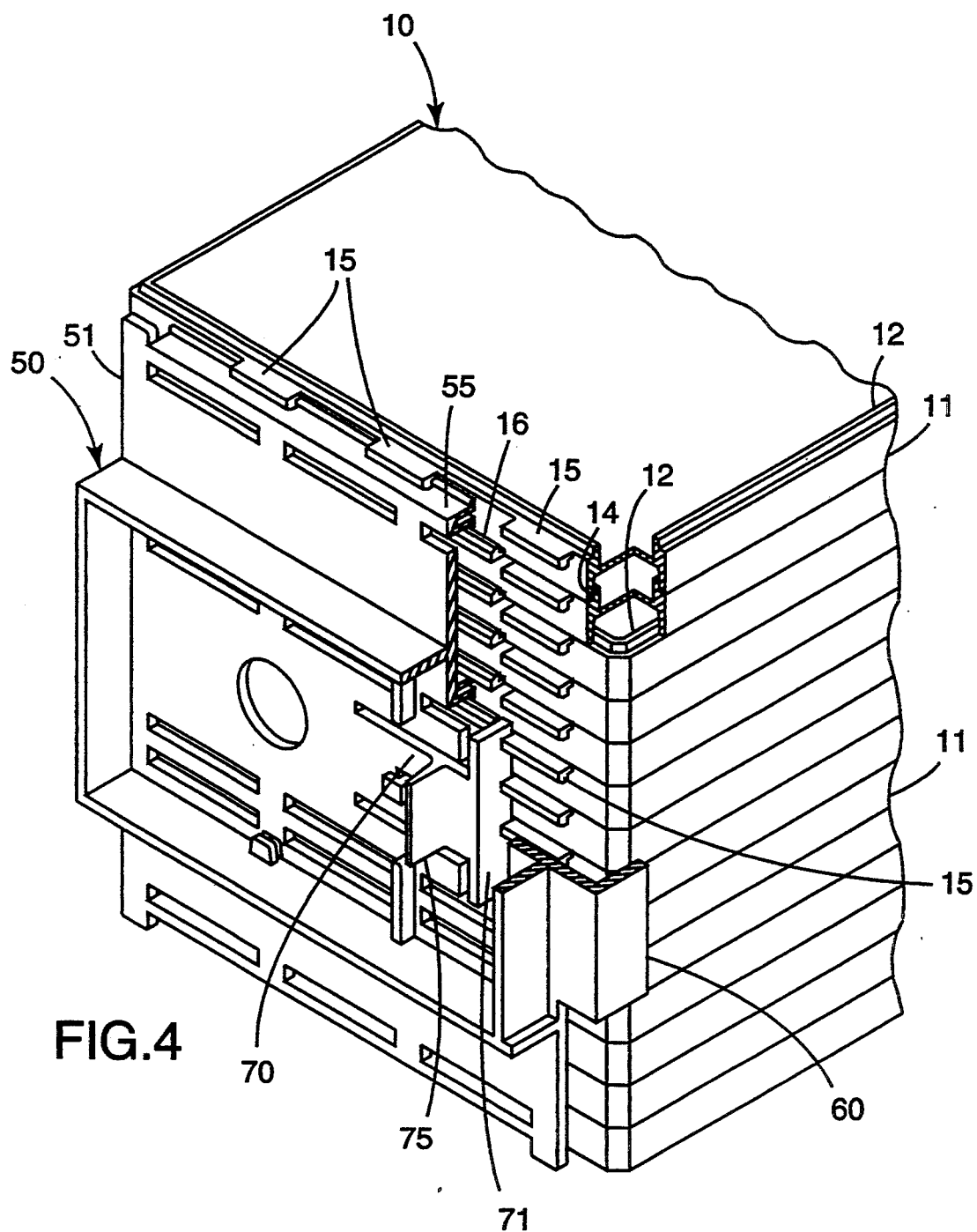
FIG. 4 is a fragmentary isometric view, partly in section, of a clip according to the present invention positioned on one end of a stack of trays.
Figure 6:
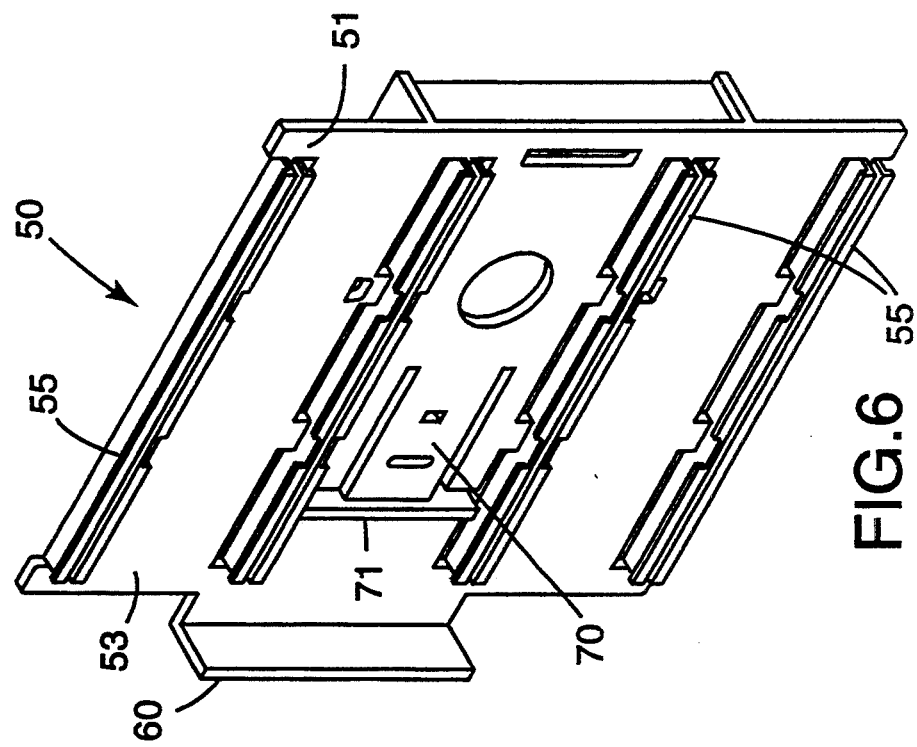
FIG. 6 is an isometric view showing the rear of the clip of FIG. 5.
Figure 5:
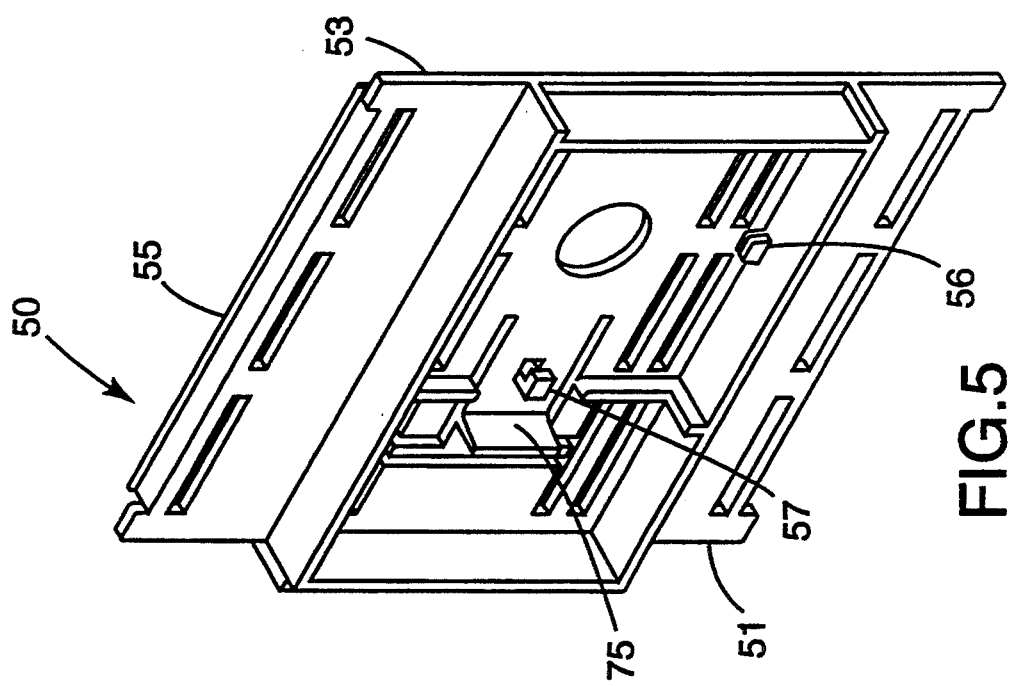
FIG. 5 is an isometric view of a second embodiment of the clip of the present invention.

Referring now to FIGS. 4, 5 and 6 a clip 50 is illustrated which is similar to clip 20 except for a modification of the latch means. FIG. 4 illustrates a clip 50 positioned on the brick of trays 10. The clip 50 has a plurality of rails 55 positioned between the end tabs 15 and 16, with a back surface 53 of the clip platform 51 positioned generally planer to the outer edges of the end tabs 15 and 16, and with the edge stop 60 engaging the longitudinal edge of the stack of trays adjacent a corner thereof.

The latching means for the clip 50 is a modification of the clip 20 in that a bar 70 is formed in an opening and is positioned generally planer with the platform 51 and is fixed at one end to the platform 51 and it will flex along its length from said one end. Alternatively a leaf spring may provide the biasing means. Extending rearwardly from the back surface of the bar 70, and transversely thereof, is a bar 71 forming the stop or latch, which, as illustrated in FIG. 4, is positioned transversely of and between a pair of end tabs 15 and 16 on the brick of trays 10. From the opposite surface of the bar 70 extends a handle 75 which is in the form of a bar or lever, extending forwardly from the bar 70. The handle 75 defines actuating means for raising one end of the bar 70 and the stop 71 to the level of the rear surface 53 to permit the clip to slide on or off the stack of trays.

In this embodiment, a lip 57, corresponding to the lips 56 positioned from the box like handle means, is formed on the bar 70 to help hold an identification card on the clip 50. The rails 55 and other features, handle means, edge stop openings, are similar to those described with relationship to the clip 20.

Referring now to FIGS. 7 and 8, another embodiment of the clip is illustrated, and clip 80 is similar to clip 20 and clip 50 except for a modification of the latch means. The clip 80 has a platform 81 with a front surface 82 and a back or rear surface 83 and a plurality of spaced parallel rails 85, having a generally T-shaped cross section adapted to be slidably positioned between end tabs 15 and 16 of a brick of trays 11. An edge stop 90 is provided on a trailing edge of the platform for engaging the longitudinal edge of the stack of trays.

The latching means for the clip 80 comprises a narrow bar 87, disposed in the plane of the platform and in an opening in the platform and fixed at one end to the platform 81. The bar 87 is fixed at one end to the platform 81 and it will flex along its length from said one end. Alternatively, the bar 87 may be hinged and a leaf spring may provide the biasing means. Extending rearwardly from the back surface of the bar 87, and transversely thereof, is a projection or bar 88 forming the stop or latch, which, as best illustrated in FIG. 7, extends from the plane of the rear surface 83. Opposite the bar 88, and on the forward surface of the clip 80, are arcuate members 89, positioned transversely of the bar 87, adapted for actuating the latch to lift the bar 88 to the plane of the platform 81. In this embodiment there is also provided a gusset plate 91, defining a cam to raise the latch bar 88 upon the sliding of the clip 80 onto a brick of trays. The arcuate members form the actuating means for the clip 80 such that a lifting force exerted on the arcuate members 89 will release the latch bar 88 to afford the ready removal of the clip 80. The other features of the clips 20 and 50, such as handle means on the front surface, stops and openings are the same on the clips 80 and description does not have to be repeated.

Referring now to FIGS. 9 and 10, a stack 100 of the thin matrix JEDEC type trays 101 are illustrated, which trays are adapted to support integrated circuit (IC) devices in rows and columns across the widths of the trays. The trays 101 conform to the JEDEC standard for thin-trays. The trays 101 are normally 0.300 inch (7.62 mm) high, 135.9 mm wide, 315 mm long with end tabs 102 at each end increasing the total length to 322.6 mm, and each tray is formed with a lip 103 and a recessed lower edge to permit the trays to nest together in a stack as shown in FIG. 10 in the upper right corner. The end tabs 102 of the thin tray are formed only along the upper portion of the tray as shown in FIG. 9 and extend 92.1 mm along the end, but they are not centered on the end.

Two identical clips may slideably engage the end tabs 103 of a plurality of trays in the stack, particularly the top and the bottom trays of the stack to hold the same together. One clip 105 is illustrated in FIGS. 9 and 10 and the clip 105 is formed with a platform 106 having a front surface 107 and a rear surface 108. The clips are formed with spaced parallel rails 110 projecting from the rear surface 108 of the platform. Two of the rails 105 are positioned along the upper and lower edge of the platform respectfully and the rails are formed to have a generally T-shaped cross section. Each rail has a beam and oppositely directed flanges. The flanges on the rails 110 are spaced such that a flange on each rail engages an end tab 102 of a tray in the stack. The top rail 110 is positioned above the end tab of the top tray, which serves as the cover, and the next rails have a flange engaging the foot of the end tap 102 of a tray in the stack 100.

The clip 105 is provided with the latch means which fits over the end of the end tabs, at the end opposite the stop which engages the side wall of the stack of trays, and handle means 108 to facilitate the positioning of the slip and carrying the trays.

The clips 20, 50, 80 and 105 are very similar and are formed preferably by a single molding operation using a thermoplastic ejection molding compound that is resistant to continuous temperatures in the range of 200° C. A suitable material is the material forming the JEDEC type trays. An example is a polyethersulphone.

The clips are dimensionally such that they can engage the top and bottom trays of the stack and with only a few sizes, the clip according to the present invention can hold most any sized stack. The clips have a length sufficient to suitably cover a majority of the width of the stack of trays such that the handle means, the box like structures can be readily grasped to balance the stack. The preferred length is about 5 inches (12.7 cm).

Having described the present invention in reference to several embodiments, it is to be understood that changes in the structure may occur to one skilled in the art without departing from the spirit or scope of the invention as defined in the appended claims.

We claim:

1. A clip for attaching individual trays in a stack, which trays are formed for nesting and with end tabs located on the opposite ends of the trays, said clip comprising:
   a platform having a front and a rear surface and a leading and trailing edge,
   a plurality of spaced rails positioned parallel with each other positioned on the rear surface of the platform, said rails having a generally T-shape in cross-section,
   an end stop projecting from the trailing edge of the platform in a rearward direction for limiting the movement of said platform across the end of a said stack of trays, and
   latch means formed on said platform for locking said platform onto the end of a stack of trays, said latch means comprising a stop projecting in a rearward direction, biasing means to normally position the stop in a position projecting rearward from the rear surface of the platform, and actuating means for moving said stop against said biasing means to move said stop from the rearward projecting position to a position in the plane of said rear surface.

2. A clip according to claim 1 wherein said platform has handle means formed on said front surface for aiding in the positioning of the clip on said stack of trays, for protecting said actuating means from accidental displacement and for gripping to carry said stack of trays.

3. A clip according to claim 1 wherein detent means are provided on said front surface of said platform for engaging the edges of a card, and said platform has handle means surrounding said actuating means and said detents to restrict accidental displacement of the actuating means and card.

4. A clip according to claim 3 wherein said platform has an access opening through said platform in the area of said detent means to afford removal of said card from said detent means by forcing an object through said opening from the rear surface of said platform.

5. A clip according to claim 1 wherein said latch means comprises a bar formed in the plane of said platform and attached to said platform, said bar having said stop extending from the bar in the rearward direction and said actuating means comprises a handle extending from the bar in the front direction to which handle a force can be directed to move said stop against the biasing means from said normal position to a position generally flush with the rear surface of the platform.

6. A clip according to claim 5 wherein said stop is moved when a force on said handle is toward the front surface of the platform.

7. A clip according to claim 5 wherein said stop is a bar extending transverse to the ribs and said actuating means is a handle having a curved shape to permit the lifting of an end of the bar.

8. A clip according to claim 5 wherein said latch means further includes means for moving the stop out of the way during the placement of the platform onto a said stack of trays with the rails engaging the end tabs thereof.

9. A clip according to claim 5 wherein said platform is formed with handle means on the front surface for grasping a stack of trays to carry the stack of trays.

10. The clip according to claim 9 wherein the platform is formed with means for retaining an identification card within the handle to label the stack.

11. A clip according to claim 1 wherein said clip is formed of a molded thermoplastic material and said latch means comprises an integrally molded bar formed in the plane of said platform and having said stop extending from the bar in the rearward direction and said actuating means comprises a handle extending from the bar in the front direction to which handle a force can be directed to move said stop from said normal position to a position generally flush with the rear surface of the platform.

12. A clip according to claim 1 wherein said latch means comprises a bar formed in the plane of said platform and having torsion biasing means supporting said bar from the platform, said bar having said stop extending transverse to the bar in the rearward direction and said actuating means comprises a handle extending from the bar in the front direction to which handle a force can be directed to move said bar about said biasing means to move said stop from said normal position to a position generally flush with the rear surface of the platform.

13. A clip according to claim 1 wherein said clip is formed of a molded thermoplastic material and said latch means comprises an integrally molded bar formed in the plane of said platform, said biasing means comprises trunnions molded integrally with the bar and said platform and positioned between the ends of the bar and between the edges of said bar and the platform, said stop extending from the bar in the rearward direction transverse of the bar and adjacent to one end of the bar and said actuating means comprising a handle extending from the bar in the front direction from the opposite end of said bar to which a force can be directed to flex on said trunnions for moving said stop from said normal position to a position generally flush with the rear surface of the platform.

* * * * *